United States Patent [19]
Bazuin et al.

[11] Patent Number: 6,163,172
[45] Date of Patent: Dec. 19, 2000

[54] CLOCK LOSS DETECTOR

[75] Inventors: Gary John Bazuin, South Lake Tahoe; Joseph Harold Gray, Palo Alto; Lars Morten Jorgensen, San Jose, all of Calif.

[73] Assignee: Graychip, Inc., Palo Alto, Calif.

[21] Appl. No.: 09/450,338

[22] Filed: Nov. 29, 1999

Related U.S. Application Data

[62] Division of application No. 09/055,221, Apr. 6, 1998.

[51] Int. Cl.[7] .................................................. H03K 19/00
[52] U.S. Cl. .............................. 326/93; 326/95; 327/18; 327/20
[58] Field of Search .............................. 327/18, 20, 24; 326/93, 95, 98

[56] References Cited

U.S. PATENT DOCUMENTS

| | | | |
|---|---|---|---|
| 4,362,957 | 12/1982 | Stern | 307/527 |
| 4,467,285 | 8/1984 | Rinaldi | 328/112 |
| 5,343,096 | 8/1994 | Heikes et al. . | |
| 5,550,487 | 8/1996 | Lyon . | |
| 5,557,620 | 9/1996 | Miller, Jr. et al. . | |
| 5,587,672 | 12/1996 | Ranganathan et al. . | |
| 5,606,270 | 2/1997 | D'Souza et al. . | |
| 5,619,157 | 4/1997 | Kumata et al. . | |
| 5,712,826 | 1/1998 | Wong et al. . | |
| 5,748,018 | 5/1998 | Beakes et al. . | |

*Primary Examiner*—Michael Tokar
*Assistant Examiner*—Anh Tran
*Attorney, Agent, or Firm*—Howrey Simon Arnold & White, LLP

[57] ABSTRACT

A system and method for providing a static mode for logic circuits with dynamic latches. The invention provides a reliable static mode for testing of the logic circuit, prevents "through current" power consumption when docks to the logic circuit are stopped, and allows the circuit to be powered down when idle. The system includes a circuit for forcing clock phases to an active state, a circuit for breaking feedback paths within the logic circuit, and an optional clock loss detector for detecting clock inactivity and automatically initiating the static mode.

2 Claims, 8 Drawing Sheets

CLOCK LOSS DETECTOR

This application is a divisional of application Ser. No. 09/055,221, filed April 6, 1998.

BACKGROUND OF THE INVENTION

1. Field of the Invention

The invention relates to logic circuits. More particularly, the invention relates to logic circuits with dynamic latches or logic.

2. Description of Related Art

Computers, phones, radios, televisions, and other electronic products are becoming more powerful and less expensive as more and more circuitry is compressed into logic circuits. Logic circuits are used for a wide variety of applications including delay registers, counters, processors, digital signal processors/filters, accumulators, pipelined arithmetic circuits, state machines, data storage registers, and other clocked circuits. A basic component of most logic circuits used today is complementary metal oxide silicon (CMOS) latches or logic. Latches are typically used to store data while the data is manipulated by other circuit logic. CMOS latches are generally designed as either dynamic or static.

A dynamic latch is smaller, faster, and more energy efficient than a static latch. Accordingly, the dynamic latch is an attractive design choice and has become the preference of circuit designers. As is known in the art, a dynamic latch can be designed with many different structures, including those disclosed in U.S. Pat. No. 5,606,270 to D'Souza et al. Typically, a dynamic latch can be implemented with only four CMOS transistors, whereas a corresponding static latch requires at least ten transistors. In other words, the typical dynamic latch is less than half the size of the static latch. Fewer CMOS transistors also equate to less loading (e.g., capacitance) on the dynamic latch. Thus, dynamic latches can operate approximately twice as fast as static latches. Less loading also means that dynamic latches require less power supply current to drive the load, thus require less power (better energy efficiency).

Notwithstanding the foregoing advantages, logic circuits with dynamic latches are problematic in certain instances. Namely, problems arise during test, reset, and power down operations.

As is well known, dynamic latches must be continually clocked (refreshed) in order to operate properly (static latches have extra transistors to retain the stored values permanently and thus do not require refreshing). As the name "dynamic" implies, the storage state of a latch will change with time and thus needs to be refreshed. This is generally not an issue during normal circuit operation because a clock is always available for refreshing.

One problem is that during test, reset, and power down operations a clock is typically not available. In other instances it is also desirable to turn the clock off in order to conserve power. Without a clock for refreshing, dynamic latches slowly change states and/or lose the stored values.

Another problem is "through currents." This well known condition occurs because a CMOS gate becomes effectively a short circuit between power and ground whenever its input values transition between high and low states. Without a clock, a dynamic latch's storage node will remain in the transition region for an extended period of time, thereby causing the CMOS gates following the dynamic latch to become short circuits for exceedingly long periods of time.

The testing of logic circuits including dynamic latches is accordingly difficult. Circuit testers generally require stopping or stalling a test in progress to take measurements of power supply currents, input leakage currents, and output voltage levels. When a test is stopped, the clock is also stopped, and the dynamic latches eventually cause "through currents" which disturb the measurements. Special test equipment or test procedures must be used to mitigate this problem.

The reset of logic circuits with dynamic latches is also a problem. It is generally desirable to be able to reset a logic circuit when not in use or when the circuit is not being clocked. For example, a logic circuit with dynamic latches may be mounted on a module that will receive its clock from a source which is not on the module. In this instance, the logic circuit will not receive a clock until the clock source is ready. When this occurs, the dynamic latches will begin causing through currents, greatly increasing the power consumption of the module.

In addition, it is generally desirable to power down a logic circuit when not in use to reduce power consumption. Because logic circuits draw current whenever clocked, it is desirable to turn off the clock when the logic circuit is not in use. This is not possible with dynamic latches because the resultant through current will actually increase the power consumption of the circuit.

One disadvantage of conventional solutions is that the logic circuit is not placed into a fully static mode. For example, extra circuitry can be used to generate an alternate clock (with a frequency much lower than that of the clock used for refreshing) for use once the clock of the logic circuit is stopped. See, e.g., U.S. Pat. No. 5,587,672 to Ranganathan et al. Since this type of solution does not make the logic circuit fully static, the circuit continues to draw power and further complicates testing.

Another disadvantage of conventional solutions is that they require considerable size and complexity to implement. For example, one such solution requires "back bias" dynamic circuits to reduce or eliminate leakage that causes dynamic storage nodes to lose their charge. See, e.g., U.S. Pat. No. 5,550,487 to Lyon. Another solution requires "self reverse biasing" circuitry to eliminate or reduce the leakage. See, e.g., U.S. Pat. No. 5,606,270 to D'Souza et al. Conventional solutions also require gates for driving dynamic nodes when the latches are not clocked. See, e.g., U.S. Pat. No. 5,557,620 to Miller, Jr. et al.

SUMMARY OF THE INVENTION

The invention is an apparatus and method for providing a static mode for logic circuits with dynamic latches or logic, while overcoming the disadvantages and drawbacks of conventional solutions. The invention can be utilized for test, reset, power down, and other logic circuit applications.

The invention includes several features. One feature of the invention is the stopping of all clock phases during test, reset, or power down operations, thereby placing a logic circuit into a static mode and saving power. Embodiments of the invention include a static_mode signal that is asserted during these operations and a clock phase generator that forces all clock phases to an active state in response to the static_mode signal.

Another feature of the invention is the breaking, or interrupting, of feedback paths (loops) within the logic circuit, thereby preventing the logic circuit from becoming unstable while in the static mode. Embodiments of the invention include circuitry that interconnects with the logic circuit feedback paths and breaks the feedback path in response to the static_mode signal. In addition, since most logic circuits are typically designed with control circuitry and signals (e.g., a reset circuit and a reset signal) to break feedback paths, other embodiments of the invention integrate, with minimal additional circuitry, the static_mode signal feature of the invention into the existing control circuitry.

The invention also includes the feature of detecting clock inactivity (clock loss detection) and automatically asserting the static_mode signal. Embodiments of the invention include a clock loss detector with two dynamic latches coupled to NMOS and PMOS transistors that are particularly designed to quickly detect inactivity of the clock. Once detected, the clock loss detector asserts a clock_loss signal which in turn causes the static_mode signal to be asserted, thereby automatically forcing the logic circuit into static mode.

The invention accordingly provides cost effective, efficient, and reliable solutions for providing a static mode for logic circuits with dynamic latches or logic. One advantage is that embodiments of the invention require very few gates to implement. Moreover, the invention allows circuit applications that previously required static latches to now use dynamic latches, therefore significantly reducing the size and cost of such circuit.

The invention also advantageously integrates efficiently into most logic circuit designs and does not require modification to the functionality of the logic circuit itself.

Another advantage is that the invention detects inactivity of clocks and automatically forces the logic circuit into the static mode before the circuit appreciably suffers from through currents.

The foregoing, and other features and advantages of the invention, will be apparent from the following, more particular description of the preferred embodiments of the invention, the accompanying drawings, and the appended claims.

DETAILED DESCRIPTION OF THE PREFERRED EMBODIMENTS

The preferred embodiments of the invention are now described with reference to the figures where like reference numbers indicate like elements. Also in the figures, the left most digit of each reference number corresponds to the figure in which the reference number is first used. As used herein, logic circuits (dynamic logic circuits or logic circuit cores) include integrated circuits, application specific integrated circuits (ASICs), chips, gate arrays, standard cells, or any other circuit having CMOS latches or logic. As would be apparent to one skilled in the art, logic circuits are used for a wide variety of applications including simple latches, delay registers, counters, processors, digital signal processors/filters, accumulators, pipelined arithmetic circuits, state machines, data storage registers, and other clocked circuits. In addition, although the invention is discussed in the context of test, reset, and power down operations, the invention can be readily utilized with other logic circuit operations and applications.

Figure 1:
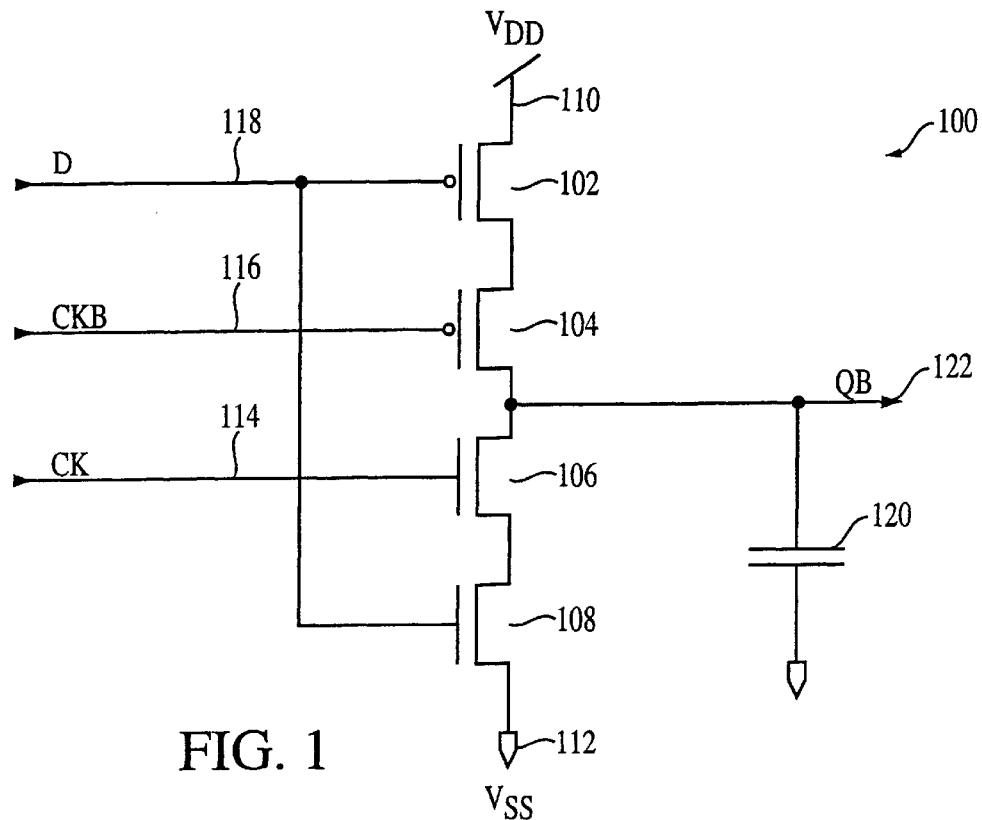
FIG. 1 is a transistor level diagram of a dynamic latch.
Figure 2:
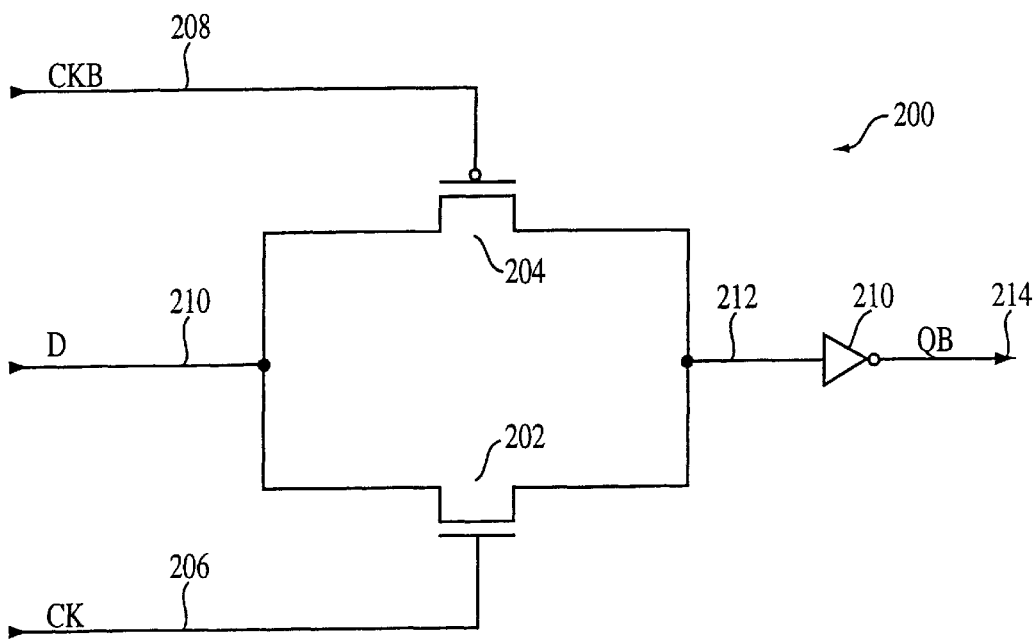
FIG. 2 is a transistor level diagram of another dynamic latch.

One feature of the invention is that a logic circuit having conventional dynamic latches with metal-oxide-silicon (MOS) transistors need not be modified to practice the invention. FIGS. 1 and 2 are transistor level diagrams of two types of dynamic latches. FIG. 1 illustrates a dynamic latch 100, which is typically called a clocked inverter. Dynamic latch 100 includes two p-type MOS (PMOS) transistors 102 and 104 and two n-type (NMOS) transistors 106 and 108 connected in series. PMOS transistor 102 is connected to power (VDD) 110 and NMOS transistor 108 is connected to ground (Vss) 112. The gate of NMOS transistor 106 is controlled by a clock (CK) signal 114 and the gate of PMOS transistor 104 is controlled by an inverted clock (CKB) signal 116. An input data (D) 118 signal is connected to the gates of transistors 102 and 108. An output data (QB) signal 122 is connected to a storage capacitor 120. As is well known, storage capacitor 120 is typically the wiring and gate load capacitance of circuitry (not shown) connected with QB 122.

In operation, when CK 114 is active (high, logic high, logic "1," or high voltage) and CKB 116 is inactive (low, logic low, logic "0," or low voltage), dynamic latch 100 acts as an inverter and QB 122 is driven with a logic value opposite that of D 118. When the CK 114 is inactive and CKB 116 active, dynamic latch 100 acts as a latch since QB 122 is electrically isolated from D 118. The logic value of QB 122 will remain unchanged as long as the charge remains on storage capacitor 120. In this embodiment, the output of dynamic latch 100 is inverted. A non-inverted output signal can be provided by adding an inverter to output node QB 122. Latch 100 is called "dynamic" because transistor leakage will cause storage capacitor 120 to lose charge over time and eventually the logic value stored at QB 122.

FIG. 2 illustrates a dynamic latch 200 that has another type of commonly used structure. Dynamic latch 200 includes a NMOS transistor 202 connected in parallel with a PMOS transistor 204. The gate of NMOS transistor 202 is controlled by a clock (CK) signal 206 and the gate of PMOS transistor 204 is controlled by an inverted clock (CKB) signal 208. An input data (D) signal 210 is connected to the source of both transistors 202 and 204. The drains of both transistors 202 and 204 are connected at a node 212 to an inverter 210 which provides a data output (QB) signal 214. The storage node of dynamic latch 200 is the input gate capacitance of inverter 210. As will be apparent to one skilled in the art, dynamic latches using other clocked gates such as clocked NAND gates and clocked NOR gates are equivalent, for the purposes of the invention. Examples of other types of clocked gates and dynamic latch circuits are disclosed in U.S. Pat. No. 5,606,270 D'Souza et al., which is herein incorporated by reference.

Figure 3:
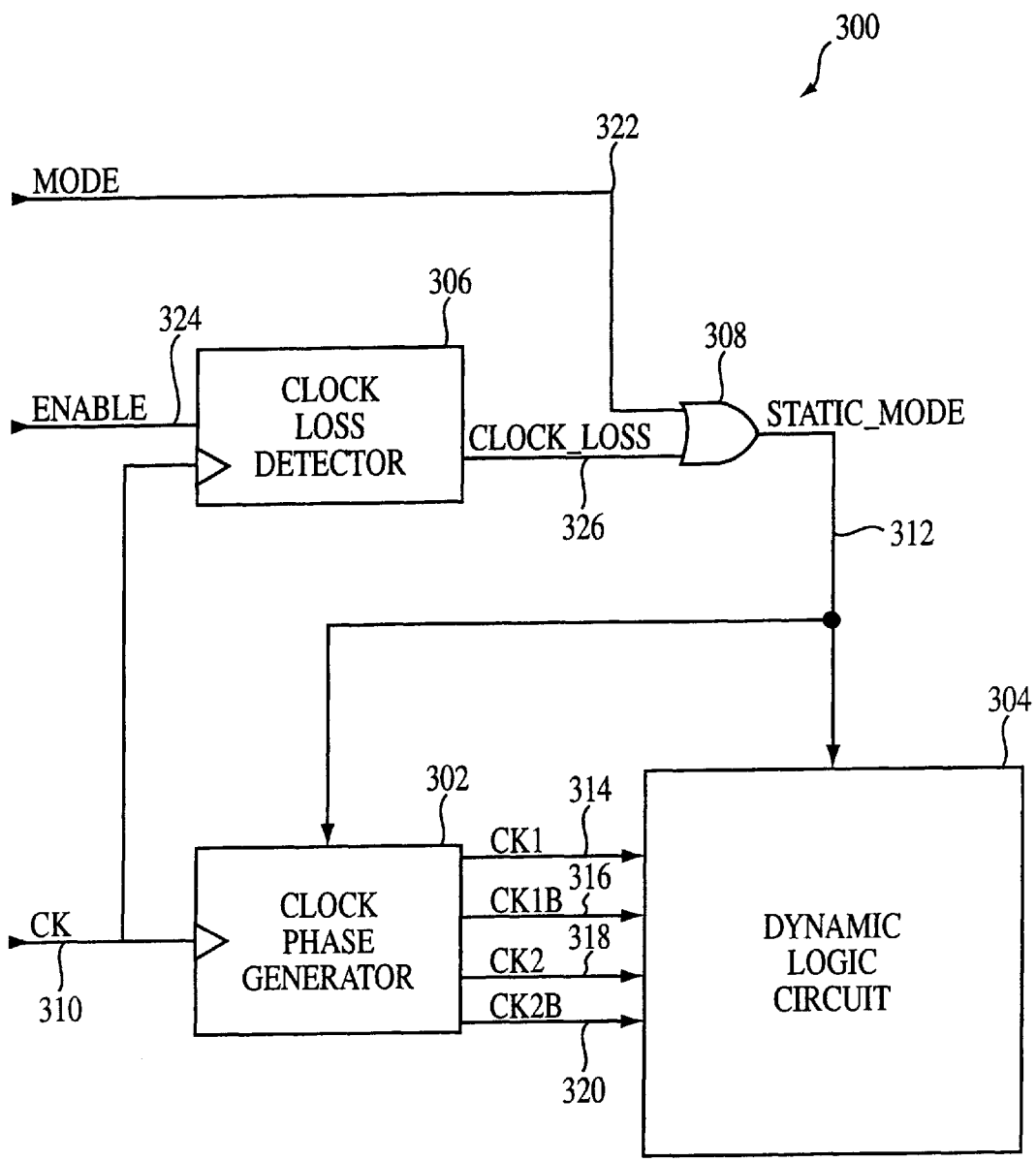
FIG. 3 is a high level block diagram of a logic circuit in accordance with the invention.

FIG. 3 is a high level block diagram of a logic circuit 300 in accordance with the principles of the invention. Logic circuit 300 includes a clock phase generator 302 and a dynamic logic circuit 304, which has dynamic latches as discussed with reference to FIGS. 1 and 2. In this embodiment, dynamic logic circuit 304 is a two-bit counter. However, dynamic logic circuit 304 can be any logic circuit (e.g., processor or state machine). Logic circuit 300 also includes a clock loss detector 306 and an OR gate 308 which are optional features of the invention.

Logic circuit 300 receives a mode signal 322 and an enable signal 324. Mode signal 322 is asserted high when logic circuit 300 is to be placed into a static mode of operation, such as during test, reset, or power down operations. Throughout the description of the preferred embodiments, signals are described as active high or low. However, as one skilled in the art would appreciate, the invention is not limited to only embodiments that use such active level signals (e.g., an active low enable signal, with an inverter, can be used with the invention). A logic high on enable signal 324 enables clock loss detector 306, thereby allowing clock loss detector 306 to assert a clock_loss signal 326 upon the detection of inactivity on a system clock (CK) signal 310. Circuitry external to logic circuit 300 generates mode signal 322 and enable signal 324 which are interfaced to logic circuit 300 via two external pins. These signals can also be generated by other external devices (e.g., switches or computer systems) or be generated on the same integrated circuit as an embodiment of the invention. For example, these signals can be mapped to a programmable register within an integrated circuit in accordance with the invention.

Clock phase generator 302 receives CK 310 and a static_mode signal 312. CK 310 is a free running clock signal and is generated by a well known clock generator or oscillator circuit (not shown). Clock phase generator 302 outputs clock signals CK1 314, CK1B 316, CK2 318, and CK2B 320, which are connected to logic circuit 304. In this embodiment, CK1B 316 and CK2B 320 (inverted versions of CK1 314 and CK2 318, respectively) are provided to eliminate the need for clock inverters within logic circuit 304. Also, CK1 314 and CK2 318 are 180° out of phase with each other. As would be apparent to one skilled in the art, however, the number of clock signals and the corresponding frequencies, phase relationships, and duty cycles are design parameters which will vary from one application to another.

Figure 4:
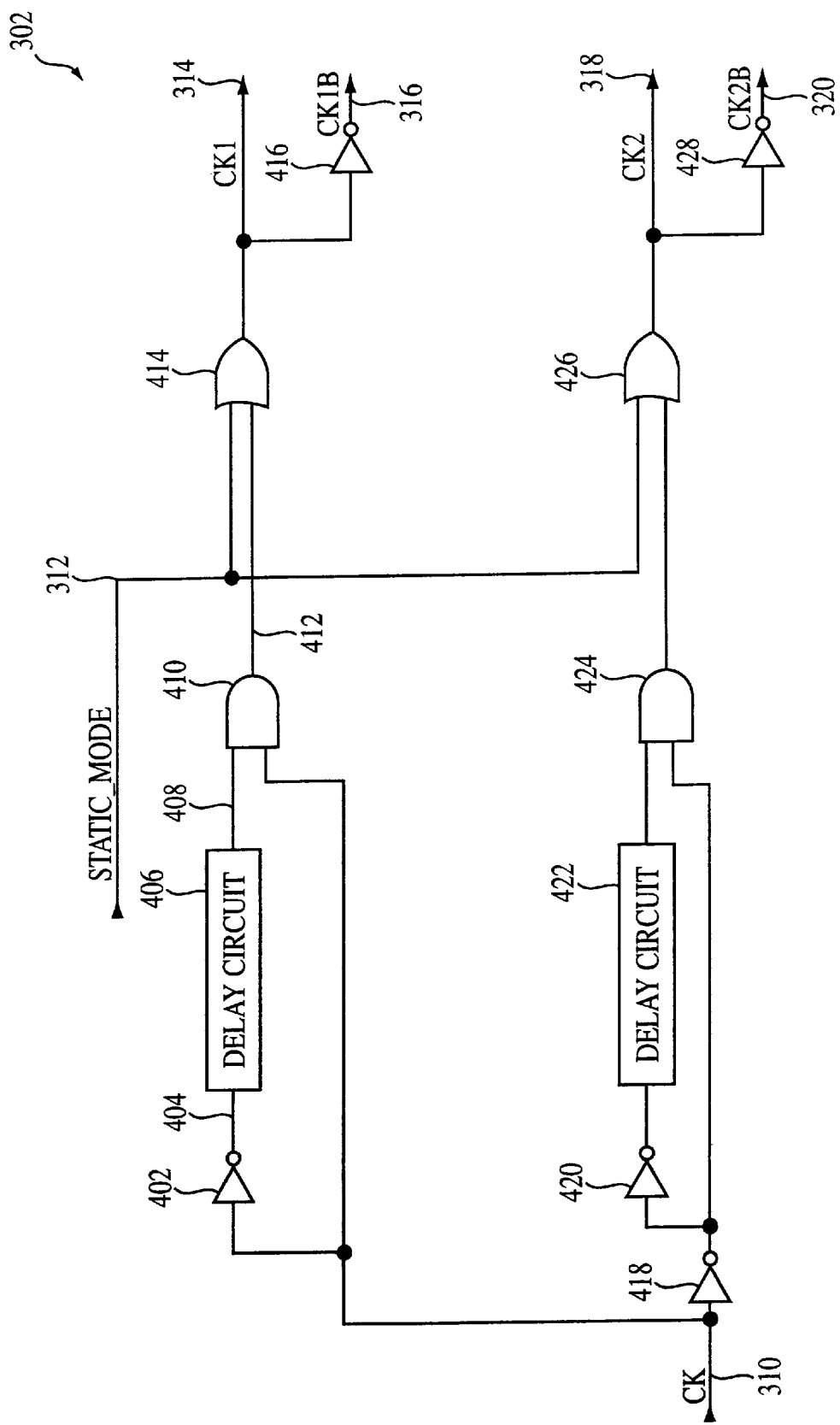
FIG. 4 is a detailed circuit diagram of a clock phase generator in accordance with the invention.

FIG. 4 illustrates a detailed circuit diagram of clock phase generator 302 in accordance with the invention. In normal operation (i.e., static mode signal 312 low), clock phase generator 302 generates high pulses of CK1 314 with each transition from low to high (positive edge transition) of CK 310, and similarly generates a high pulse of CK2 318 with each transition from high to low (negative edge transition) of CK 310. In particular, when CK 310 is low, an inverter 402 drives a node 404 high. After a predetermined delay, circuit 406 drives a node 408 high. As the CK 310 is low and node 408 is high, an AND gate 410 drives a node 412 low. Correspondingly, CK1 314 is low as node 412 and static_mode signal 312 are both low. When CK 310 goes high, AND gate 410 drives node 412 high, which in turn causes CK1 314 to be high. In addition, inverter 402 drives node 404 low and after the delay through circuit 406, node 408 is driven low. AND gate 410 thus brings node 412 low, and CK1 314 goes low again.

The width of the high pulse of CK1 314 is approximately equal to the predetermined delay of circuit 406. In this embodiment, delay circuit 406 is constructed as a series of inverters (not shown) and the predetermined delay is set for approximately 40% of the period of CK 310. Other well known delay circuits, however, can be practiced with the invention. CK1B 316 is generated by an inverter 416.

Clock phase generator 302 has the identical circuitry for the generation of CK2 318 and CK2B 320, including inverters 420 and 428, a delay circuit 422, an AND gate 424, and an OR gate 426. In addition to the foregoing, an inverter 418 inverts CK 310 which causes a high pulse of CK2 318 to be generated with each high to low transition (negative edge transition) and a low pulse with each low to high transition (positive edge transition) of CK 310.

In this preferred embodiment, clock phase generator 302 also receives static_mode signal 312 which is connected to the inputs of OR gates 414 and 426. In this embodiment, static_mode signal 312 is synchronous with CK 310, however, an asynchronous signal can also be used with the invention. In normal operation, static_mode signal 312 is low and clock phase generator 302 performs as discussed above. In static mode (e.g., during test, reset, or power down operations), however, static_mode signal 312 is asserted high, stopping CK1 314 and CK2 318 (forced high) as well as CK1B 316 and CK2B 320 (forced low). Alternative circuitry can be used to stop the clocks. For example, OR gates, or equivalent circuits, can be used to receive static_mode signal 312, within dynamic logic circuit 304 itself to stop the clocks. In addition, other clock phase generators can be used with the invention, as long as logic, such as OR gates 414 and 426, is added to stop the clocks in the active high state in response to static_mode signal 312.

Dynamic logic circuit 304 has a feature of reliably breaking, or interrupting, internal feedback paths (loops) thereby preventing the circuit from becoming unstable while in the static mode. In general, a feedback path returns an output (or portion thereof) of a circuit to an input of the circuit. Typically, feedback paths are used to maintain circuit performance or control. Since each dynamic logic circuit has different attributes and requirements, several preferred embodiments of the invention are now discussed with respect to FIGS. 5–9.

Figure 5:
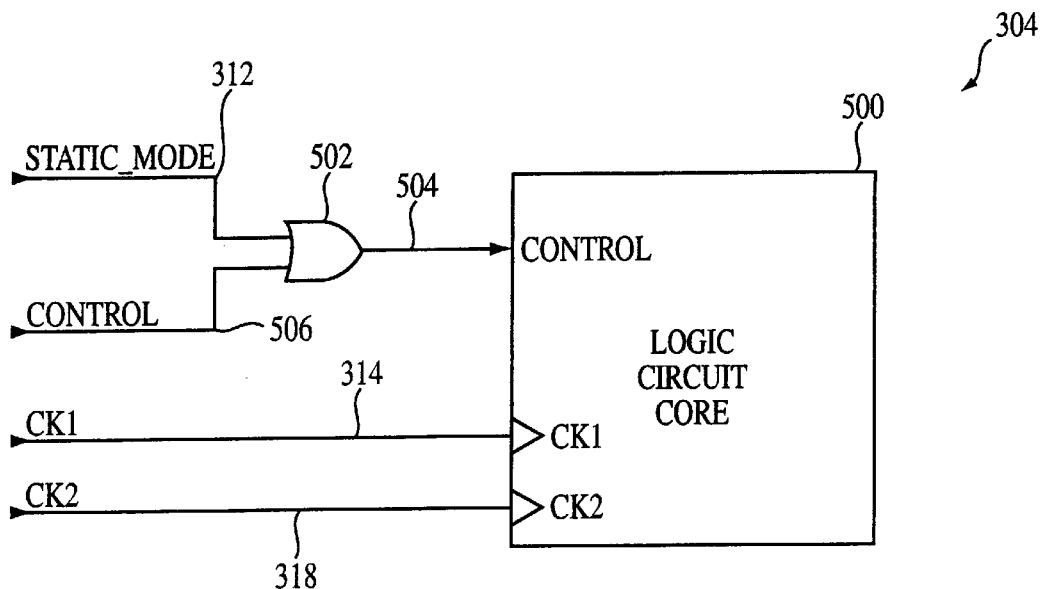
FIG. 5 is a high level block diagram of a feedback path with static_mode and control logic in accordance with the invention.
Figure 6:
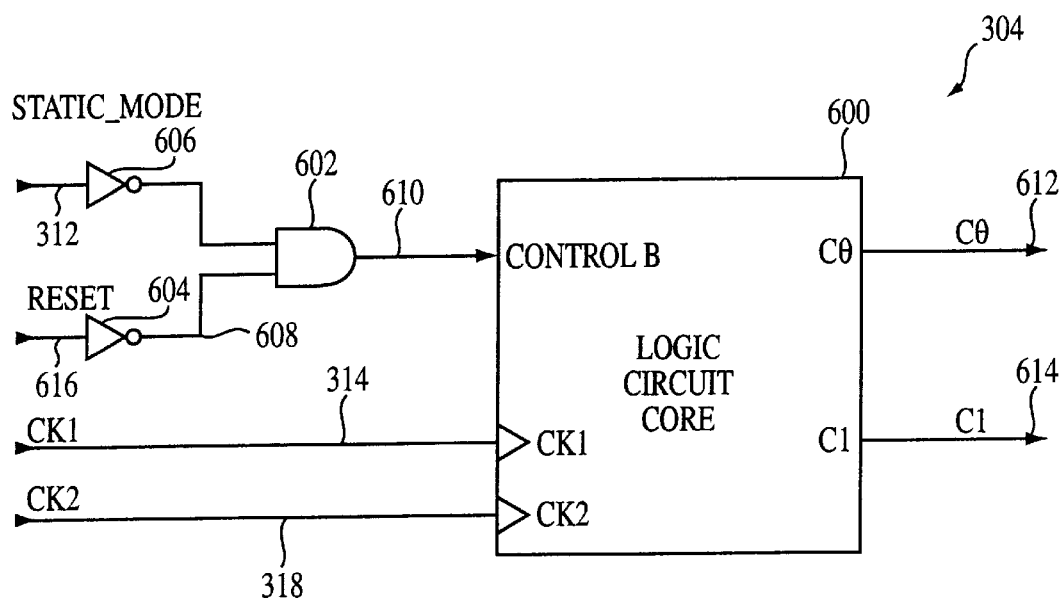
FIG. 6 is a high level block diagram of another feedback path with static_mode and control logic in accordance with the invention.

FIGS. 5 and 6 each illustrate a high level block diagram of dynamic logic circuit 304 in accordance with the invention. Many logic circuits have reset/initialization control signals that effectively break feedback paths. With such logic circuits, the invention can be integrated in the most efficient and cost effective manner. For example, with reference to FIG. 5, dynamic logic circuit 304 includes a logic circuit core 500 and an OR gate 502. Logic circuit core 500, in this embodiment, is reset or initialized when a node 504 is driven high. OR gate 502 receives static_mode signal 312 and a control signal 506. Thus, when either static_mode signal 312 or control signal 506 is asserted high, logic circuit core 500 is reset, thereby effectively breaking the internal feedback paths within logic circuit 500.

FIG. 6 illustrates another preferred embodiment of dynamic logic circuit 304 which includes a logic circuit core 600, an AND gate 602, and inverters 604 and 606. Logic circuit core 600 is a two-bit counter having an input to receive an active low control signal (ControlB) at a node 610. Logic circuit core 600 also has inputs to receive CK1

314 and CK2 318 and provides output signals C0 612 and C1 614. AND gate 602 receives an inverted reset signal 616 and an inverted static_mode signal 312 from inventors 604 and 606, respectively. In normal operation (static_mode signal 312 low), reset signal 616 governs the operation of logic circuit core 600. In static mode (static_mode signal 312 is high), however, AND gate 602 drives node signal 610 low, thereby forcing a reset condition and breaking the internal feedback paths within logic circuit 600.

Figure 7:
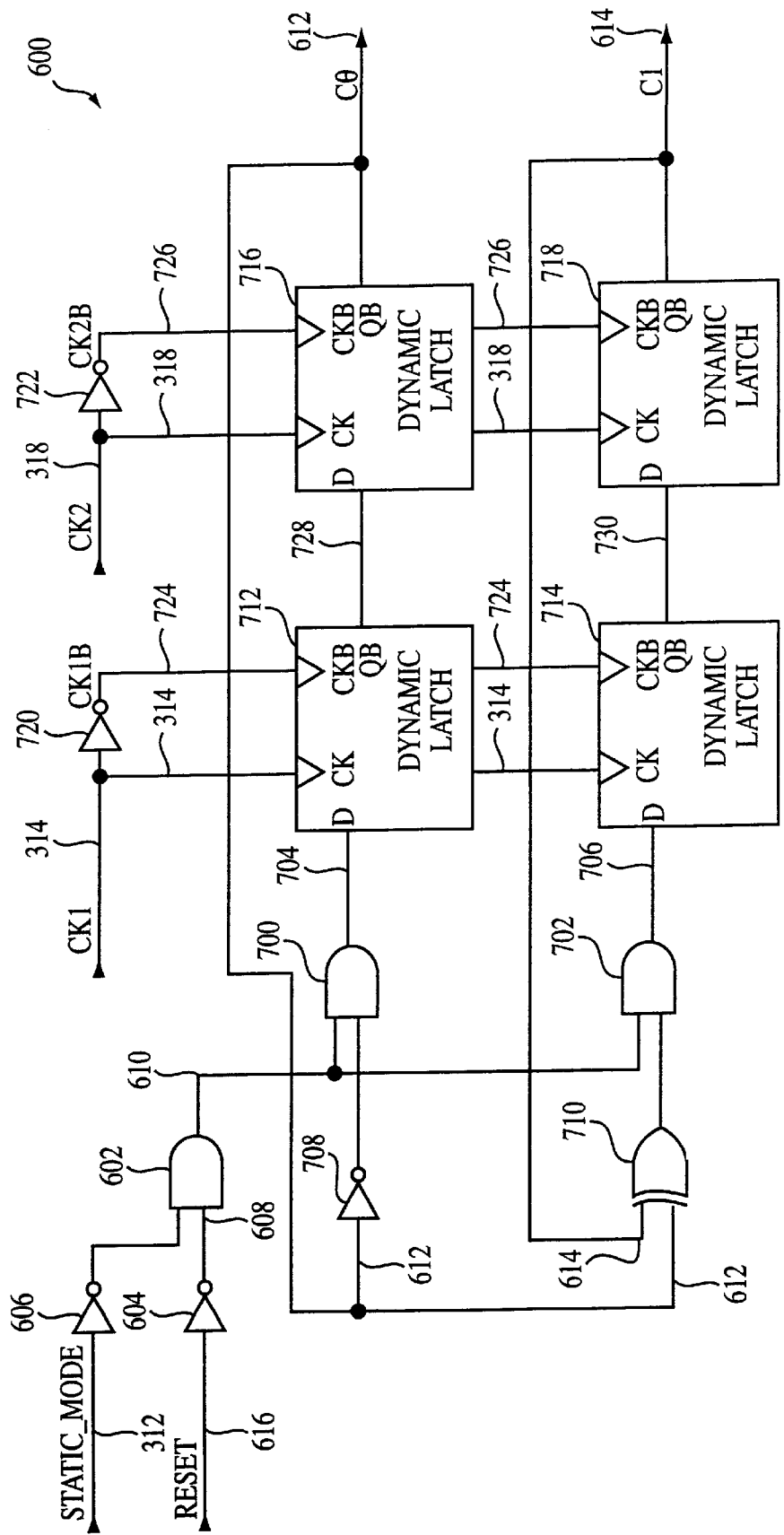
FIG. 7 is a detailed circuit diagram of a two-bit counter in accordance with the invention.

FIG. 7 illustrates a detailed circuit diagram of logic core circuit 600 (two-bit counter 600) in accordance with the invention. Counter 600 includes AND gates 700 and 702, inverters 708, 720, and 722, a XOR gate 710, and dynamic latches 712, 714, 716, and 718. CK1 314 and CK2 318 and inverted clock signals CK1B 724 and CK2B 726 (from inverters 720 and 722) are provided to latches 712, 714, 716, and 718.

During reset (reset signal 616 high and static_mode signal 312 low), AND gate 602 drives signal 610 low and correspondingly AND gates 700 and 702 drive nodes 704 and 706 low. After the assertion of reset signal 616, a cycle of CK1 314 and CK2 318 will propagate these low levels through latches 712 and 714, nodes 728 and 730, and latches 716 and 718, and the count value zero (i.e., C0=0 and C1=0) will appear on outputs C0 612 and C1 614. These outputs will remain low (zero count) until reset signal 616 is returned low.

In normal operation (both reset signal 616 and static_mode signal 312 low), counter 600 starts counting and outputs count values from 0 to 3 (C0 612 and C1 614), incrementing once every cycle of CK1 314 and CK2 318. After reset signal 616 returns low, AND gate 602 drives node 610 high and inverter 708 and XOR gate 710 control the inputs (nodes 704 and 706) to latches 712 and 714, respectively. Initially with C0 612 low, inverter 708 causes node 704 (via AND gate 700) high. In addition, the two inputs (C0 612 and C1 614) of XOR gate 710 will be low, thus causing (via AND gate 702) node 706 to stay low. A clock cycle CK1 314 and CK2 318 later, the values on 704 and 706 will propagate to outputs C0 612 and C1 614, driving the outputs to a count value of one (i.e., C0=1 and C1=0). Inverter 708 will then now cause node 704 to go low, and XOR gate 710 (with input values of high and low), will cause node 706 to go high. A clock cycle later, these values will propagate to outputs C0 612 and C1 614, driving the outputs to a count value of two (i.e., C0=0 and C1=1). Inverter 708 will then cause node 704 to go high, and XOR gate 710 (with inputs values of low and high), will cause node 706 to remain high. A clock cycle later, these values will propagate to the outputs C0 612 and C1 614, driving the outputs to a count value of three (i.e., C0=1 and C1=1). Inverter 708 will then cause node 704 to be low and XOR 710 (with both inputs high) will cause node 706 to be low. A clock cycle later, these values will drive the outputs of counter 600 to a value of zero (i.e., C0=0 and C1=0). The count sequence will then repeat (zero, one, two, three) until reset signal 616 or static_mode signal 312 is again asserted high.

In static mode (reset signal 616 low and static_mode signal 312 high), counter 600 is forced in a stable reset condition as discussed above. That is, AND gate 602 drives signal 610 low and correspondingly AND gates 700 and 702 drive nodes 704 and 706 low which in turn forces a count value of zero (i.e., C0=0 and C1=0) on outputs C0 612 and C1 614. These outputs will remain at zero while static_mode signal 312 is high regardless of the state of CK1 314 and CK2 318.

Without static_mode signal feature of the invention, counter 600 would become unstable once the clocks were stopped. Normally, counter 600 is continuously clocked by alternating pulse of CK1 314 and CK2 318, where CK1 314 and CK2 318 are non-overlapping high pulses. If, however, CK1 314 and CK2 318 are active at the same time (i.e., overlapping), all the dynamic latches (712, 714, 716, 718) are active at the same time and correspondingly counter 600 becomes unstable. For example, node 612 will be equal to node 704 at the same time that inverter 708 is trying to make node 704 the opposite value of node 612. Thus, under these conditions, counter 600 is in an indeterminate or unstable state. Accordingly, the invention modifies counter 600 to force a reset signal condition when static_mode signal 312 is high (static mode).

Figure 8:
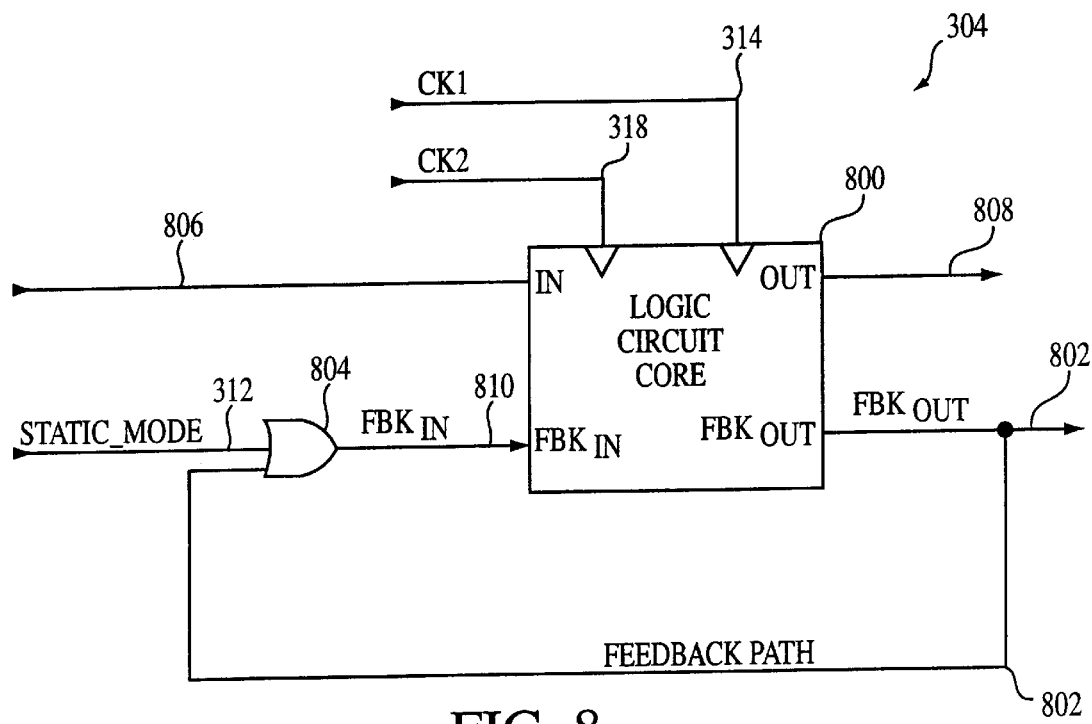
FIG. 8 is a high level diagram of a feedback path with static_mode logic in accordance with the invention.

Although some logic circuits have existing control/initialization circuitry and signals (e.g., a reset circuit and a reset signal) to break feedback paths (see, e.g., FIGS. 5–7), other logic circuits do not have this capability. In such instances, circuitry to break feedback paths can be added. For example, FIG. 8 illustrates a high level block diagram of dynamic logic circuit 304 in accordance with the invention. A logic circuit core 800 includes a feedback path output signal 802 (FBK$_{OUT}$), a feedback path input signal 810 (FBK$_{IN}$), a data input signal 806, and a data output signal 808. In accordance with the invention, an OR gate 804 is inserted into the feedback path (i.e., FBK$_{OUT}$ 802 and FBK$_{IN}$ 810). In normal operation (static_mode signal 312 low), OR gate 804 does not effect the operation of logic circuit core 800 as the value of FBK$_{OUT}$ 802 propagates to the to FBK$_{IN}$ 810 via OR gate 804. In static mode (static_mode signal 312 high), however, the feedback path input of logic circuit 800, FBK$_{IN}$ 810, is forced high, thereby the breaking feedback path. Alternatively static_mode signal 312 can be inverted and an AND gate can be used, instead of OR gate 804, to force FBK$_{IN}$ 810 low and break feedback path during static mode.

Figure 9:
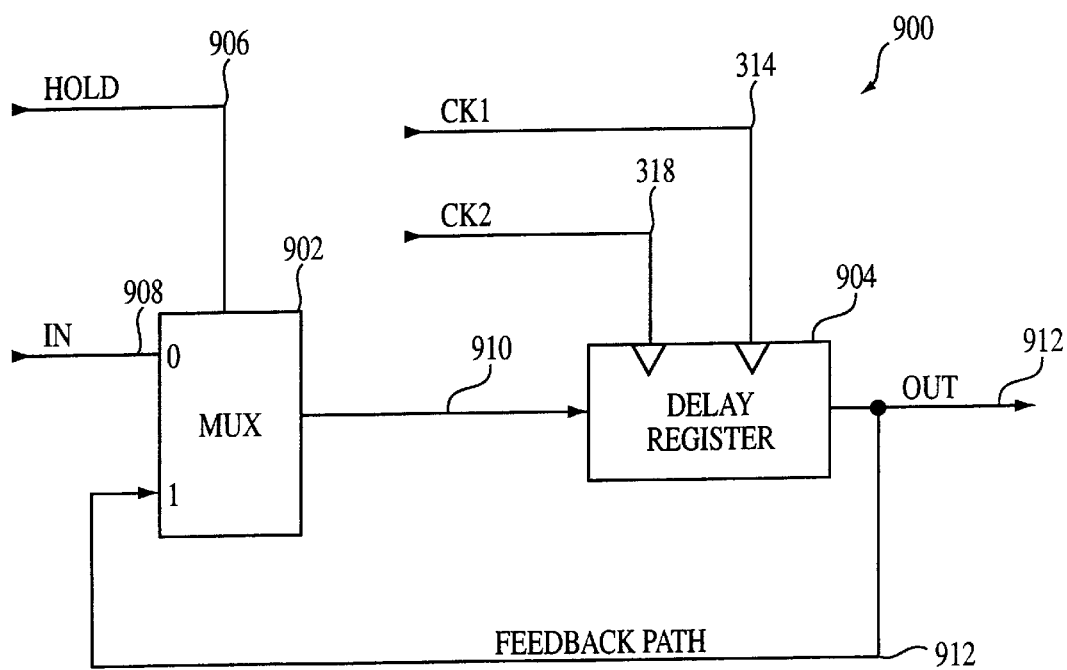
FIG. 9 is a detailed circuit diagram of a feedback path without additional static_mode and control logic in accordance with the invention.

Some other logic circuits, however, are inherently stable when the clocks are stopped, and thus do not need circuitry to break feedback paths. For example, FIG. 9 illustrates a high level block diagram of dynamic logic circuit 900 without a circuit to break a feedback path. Dynamic logic circuit 900 includes a 2:1 multiplexor 902 and a delay register 904. When a hold signal 906 is low, multiplexer 902 routes the value of an input (IN) signal 908 to a node 910. After a predetermined delay, delay register 908 outputs the value as an output (OUT) signal 912. When hold signal 906 is high, OUT 912 is fed back through multiplexer 902 to delay register 904, so the value of OUT 912 does not change. When hold signal 906 is low, IN 908 propagates directly to OUT 912 when both clocks are high. Thus, dynamic logic circuit 900 remains stable, with hold signal 906 either high or low, when both clocks (CK1 314 and CK2 318) are active. However, in another embodiment of the invention, an inverted static_mode signal 312 and hold signal 906 can be input into an AND gate, to force dynamic logic circuit 900 to be initialized with IN 908.

Referring to FIG. 3, clock loss detector 306 automatically initiates putting logic circuit 304 into static mode. Clock loss detector 306 receives CK 310 and enable signal 324 and outputs a clock_loss signal 326 which is received by OR gate 308. Upon detection of an inactive CK 310, clock_loss detector 306 asserts clock_loss signal 326 high which in turn asserts static_mode signal 312 high. Although clock loss detector circuit 306 and the enable feature are included in this preferred embodiment, they are optional features of the invention.

Figure 10:
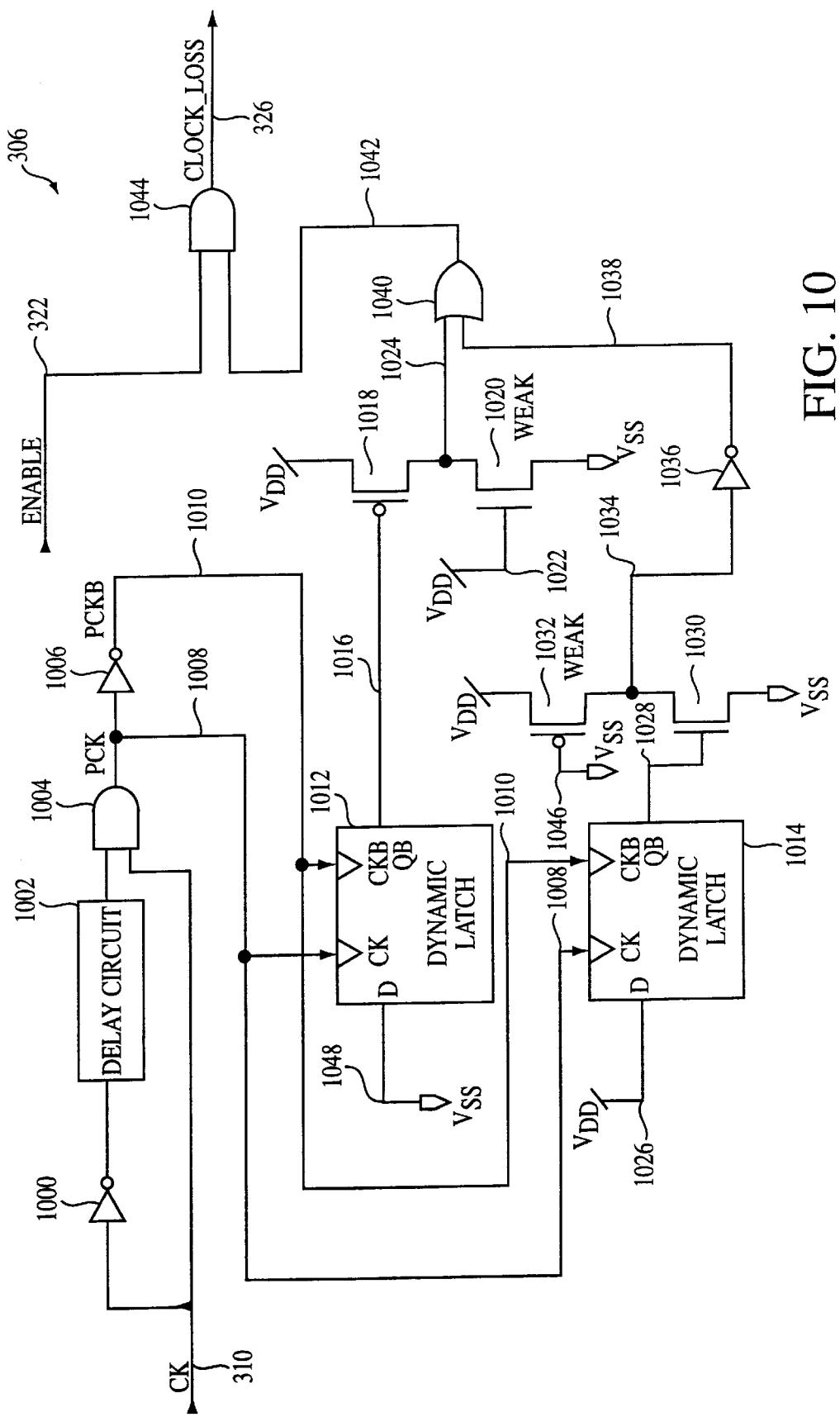
FIG. 10 is a detailed circuit diagram of a clock loss detector in accordance with the invention.

FIG. 10 illustrates a detailed circuit diagram of clock loss detector circuit 306. Clock loss detector circuit 306 receives CK 310 and generates a pulse clock (PCK) signal 1008 with an inverter 1000, a delay circuit 1002, and an AND gate 1004 (in the same manner as discussed with reference to CK1 314 of FIG. 4). An inverted pulse clock (PCKB) signal 1010 is generated by inverter 1006. PCK 1008 and PCKB 1010 are used to clock dynamic latches 1012 and 1014 (similar to dynamic latch 100 of FIG. 1).

Dynamic latch 1012 has an input 1048 grounded ($V_{ss}$) so that an inverted output (QB) at node 1016 is high. Node 1016 controls the gate to a PMOS transistor 1018. Transistor 1018 is off when node 1016 is high. This allows a "weak" NMOS transistor 1020 to pull node 1024 low. In general, a transistor can be made "weak" by using a gate width-to-length ratio much smaller than that of a standard transistor (e.g., typically a weak transistor will have a ratio of one-hundreth a standard transistor). If CK 310 stops, then node 1016 will start to lose charge and will drift low. Once node 1016 drifts lower than the threshold voltage of PMOS transistor 1018, transistor 1018 will turn on and pull node 1024 high.

Dynamic latch 1014 has an input 1026 pulled high ($V_{DD}$) so that an inverted output (QB) at a node 1028 is low. Node 1028 controls the gate of a NMOS transistor 1030. Transistor 1030 is off when node 1028 is low. This allows a "weak" PMOS transistor 1032 to pull a node 1034 high. If CK 310 stops, then node 1028 will start to drift high. Once node 1028 drifts higher than the threshold voltage of NMOS transistor 1030, transistor 1030 will turn on and pull node 1034 low. An inverter 1036 will drive a node 1038 high if node 1034 goes low.

Accordingly, clock loss detector circuit 306, with its weak NMOS and PMOS transistors 1020 and 1030, acts as a prompt warning that CK 312 has stopped and initiates the static mode before (or soon after) circuitry of dynamic logic circuit 304 goes unstable. That is, if either node 1024 or node 1038 go high, an OR gate 1040 will drive a node 1042 high. If clock loss detector circuit 306 is enabled (enable signal 322 high), an AND gate 1044 will drive clock_loss signal 326 high, indicating that CK 310 has stopped long enough that dynamic nodes within dynamic logic circuit 304 may have drifted far enough to turn on NMOS or PMOS transistors. When clock loss detector circuit 306 is disabled (enable signal 322 low), clock_loss signal 326 is held low regardless of the activity of CK 310.

Figure 11:
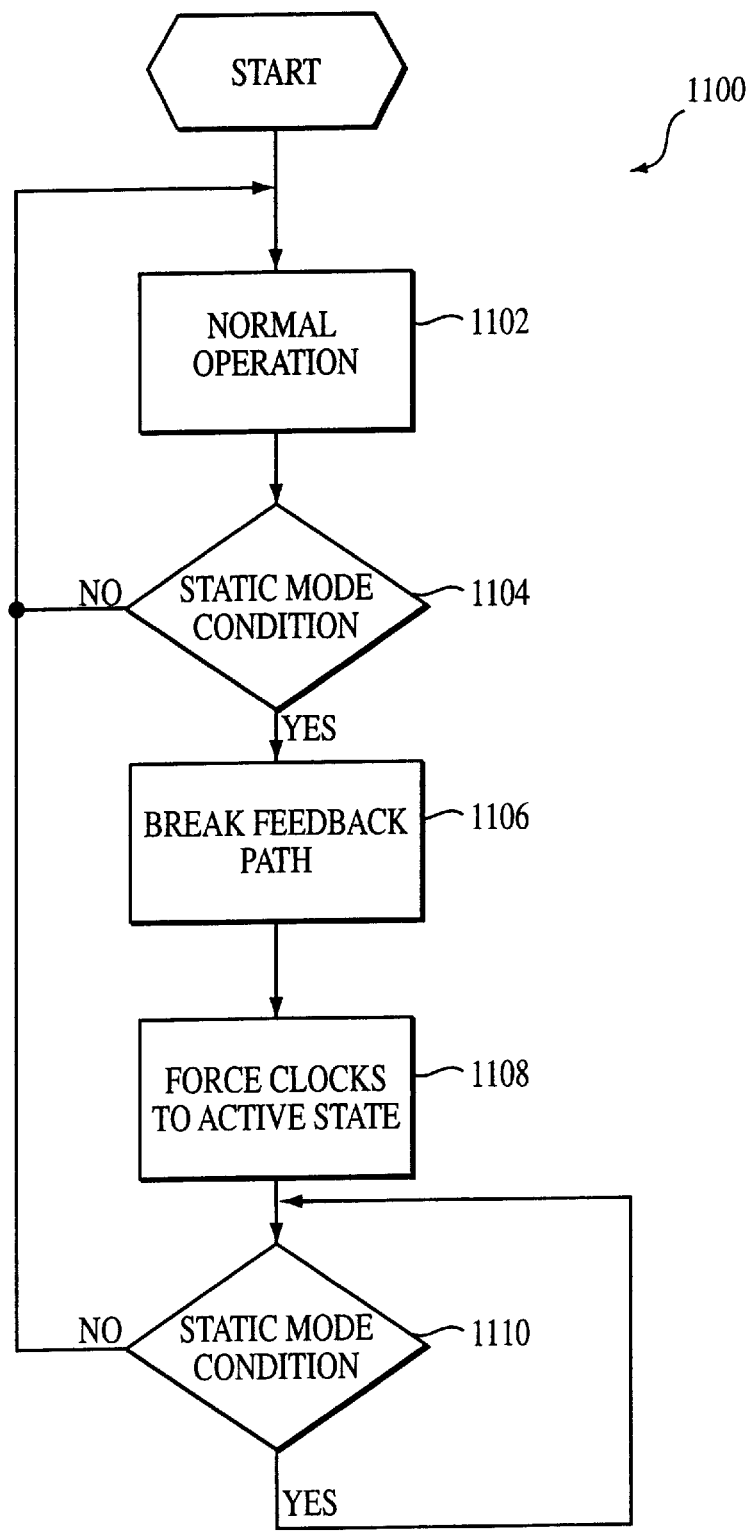
FIG. 11 is a flow diagram of a method of placing a logic circuit into a static mode in accordance with the invention.

FIG. 11 illustrates a flow diagram illustrating a method 1100 of providing a static mode for a logic circuit having dynamic latches and clock signals in accordance with the principles of the invention. During step 1102, method 1100 allows the logic circuit perform its normal operation. In step 1104, method 1100 checks for a static mode condition. As discuss above, several conditions (e.g., reset, power down, and clock loss conditions can initiate static mode. If no static mode condition is detected, method 1100 returns to step 1102 (allowing the logic circuit to continue normal operation). If, however, a static mode condition is detected, method 1100 breaks, or interrupts, a feedback path within the logic circuit during step 1106. In step 1108, the clock signals are forced into active states (in this embodiment all clock signals are force high). In step 1110, method 1100 checks whether the static mode condition still exists (or whether another static mode condition now exists). If so, method 1100 keeps the logic circuit in static mode (step 1110). If not, method 1100 returns to step 1102, for normal operation of the logic circuit. Although the steps of method 1100 are performed sequentially in this embodiment, some of these steps can be performed concurrently, or in reverse order.

As would be appreciated by one skilled in the art, the foregoing features and advantages of the invention can be realized as various cost effective embodiments. Indeed, some embodiments require only approximately 16 additional CMOS gates to implement a clock loss detector and modify a clock phase generator in accordance with the invention.

Moreover, the invention allows logic circuits that previously had to use static latches (due to problems associated with testing, resetting, and powering down operations) to now use dynamic latches to significantly reduce the size and cost of such circuits. For example, a typical static latch logic circuit can be 25% smaller with the invention, thus reducing the price of the circuit, decreasing power consumption, and increasing the operating speed.

Although the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A clock loss detector, comprising:

a clock phase generator having an input clock signal and output clock phase signals;

a first dynamic latch connected with said clock phase signals and having a first inverted output signal;

a first transistor pair having a PMOS transistor and a weak NMOS transistor connected in series, wherein the gate of said PMOS transistor is connected with said first inverted output signal;

a second dynamic latch connected with said clock phase signals and having a second inverted output signal;

a second transistor pair having a weak PMOS transistor and a NMOS transistor connected in series, wherein the gate of said NMOS transistor is coupled with said second inverted output; and a circuit connected with said first transistor pair and said second transistor pair and having an output signal, wherein said output signal is asserted when said clock signal is inactive.

2. The clock loss detector of claim 2, further comprising an enable signal connected with said circuit.

* * * * *